(12) United States Patent
Miyasaka

(10) Patent No.: US 6,177,712 B1
(45) Date of Patent: Jan. 23, 2001

(54) SCHOTTKY BARRIER DIODE HAVING A GUARD RING STRUCTURE

(75) Inventor: Yasushi Miyasaka, Nagano (JP)

(73) Assignee: Fuji Electric Co., Ltd. (JP)

( * ) Notice: Under 35 U.S.C. 154(b), the term of this patent shall be extended for 0 days.

(21) Appl. No.: 08/987,924

(22) Filed: Dec. 10, 1997

(30) Foreign Application Priority Data

Dec. 10, 1996 (JP) .................................................. 8-329395

(51) Int. Cl.$^7$ ................................................ H01L 27/095
(52) U.S. Cl. ........................ 257/484; 257/481; 257/483; 257/494
(58) Field of Search .................................. 257/480, 484, 257/494, 481, 483, 471, 605

(56) References Cited

U.S. PATENT DOCUMENTS 5,081,510 * 1/1992 Ohtsuka et al. ..................... 257/483

FOREIGN PATENT DOCUMENTS

| 58-058774A | 4/1983 | (JP) . |
| 60-206179A | 10/1985 | (JP) . |

OTHER PUBLICATIONS

R.A. Zettler et al., "Junction–Schottky Barrier Hybrid Diode", Jan. 1969, pp. 58–63, IEEE Transactions on Electron Devices, vol.ED–16, No. 1.
K. Ichikawa et al., "Design Considerations for Power Schottky Barrier Diodes", Jun. 1983, pp. 20–26,CH1855.
"Physics of Semiconductor Devices 2nd Edition", Editor S.M. Sze, 1981, John Wiley & Sons, pp. 245–311.

* cited by examiner

*Primary Examiner*—Minh Loan Tran
(74) *Attorney, Agent, or Firm*—Rossi & Associates

(57) ABSTRACT

A Schottky barrier diode is provided which has a substrate including a first-conductivity-type low concentration layer and a first-conductivity-type high concentration layer, and a guard ring region, comprising a second-conductivity-type diffusion layer having an impurity surface concentration of not greater than $5 \times 10^{17}/cm^3$, formed in the first-conductivity-type low concentration layer. The first-conductivity-type low concentration layer has a thickness large enough to prevent a depletion layer that appears in the low concentration layer upon application of the maximum reverse voltage from reaching the first-conductivity-type high concentration layer.

2 Claims, 3 Drawing Sheets

SCHOTTKY BARRIER DIODE HAVING A GUARD RING STRUCTURE

FIELD OF THE INVENTION

The present invention relates to Schottky barrier diodes, and in particular to small capacitance Schottky barrier diodes that are suitably used for a switching power supply, assuring a high destructive electric power level.

BACKGROUND OF THE INVENTION

High-speed diodes and Schottky barrier diodes are known as semiconductor devices having a rectifying function and used for a switching power supply and the like. The switching power supply having a high conversion efficiency is adapted to rectify alternating input voltage into direct voltage, convert the direct voltage into alternating voltage having a high frequency via an ON-OFF circuit, transform the alternating voltage by means of a transformer, and then rectify the resulting voltage again to convert it into direct voltage. In this switching power supply, Schottky barrier diodes having excellent high-speed switching characteristics are used as a device for performing high-frequency rectification. Significant factors for determining the efficiency of the switching power supply include a loss in the ON-OFF circuit and a forward voltage drop that occurs in the diode that performs the high-frequency rectification. In particular, the forward voltage drop in the diode is desired to be minimized so as to achieve a sufficiently high efficiency of the power supply.

However, since Schottky barrier diodes are limited to a relatively narrow range of rated voltage as compared with pn junction diodes, a circuit including the Schottky barrier diodes needs to be designed so that a reverse voltage greater than the rated voltage is not applied to the diodes. In addition, the occurrence of surge voltage must be taken into consideration. Thus, a device whose withstand voltage is one order higher than that required in the circuit design is generally used as Schottky barrier diode. Otherwise, if a voltage, such as surge voltage, that is higher than the rated voltage is applied to the Schottky barrier diode, avalanche breakdown occurs in the Schottky barrier diode, possibly causing destroy by electric power even at small current levels. Thus, the device having a high withstand voltage is selected as the Schottky barrier diode so as to minimize a possibility of the occurrence of avalanche breakdown in the Schottky barrier diode. In the meantime, the forward voltage drop is increased with an increase in the withstand voltage, which impedes an improvement in the efficiency of the power supply.

SUMMARY OF THE INVENTION

It is therefore an object of the present invention to provide a Schottky barrier diode that has a high withstand voltage and does not suffer from destroy by electric power even if high current flows due to avalanche breakdown, while assuring a sufficiently low forward voltage drop.

To accomplish the above object, there is provided a Schottky barrier diode comprising a substrate including a first-conductivity-type low concentration layer and a first-conductivity-type high concentration layer, and a guard ring region, comprising a second-conductivity-type diffusion layer having an impurity surface concentration of not greater than $5 \times 10^{17}/cm^3$, formed in the first-conductivity-type low concentration layer, wherein the first-conductivity-type low concentration layer has a thickness large enough to prevent a depletion layer that appears in the low concentration layer upon application of a maximum reverse voltage from reaching the first-conductivity-type high concentration layer.

In the Schottky barrier diode constructed as described above, the impurity surface concentration of the diffusion layer of the guard ring region is reduced down to $5 \times 10^{17}/cm^3$ which is one order of magnitude smaller than that of known prior art diodes, whereby the slope of the impurity concentration of the diffusion layer becomes less steep. As a result, the depletion layer or region extends to a greater length in the diffusion layer, and avalanche breakdown is less likely to occur in the diffusion layer. Thus, breakdown that has occurred mainly in the diffusion layer in the prior art device is caused to occur in the first-conductivity-type low concentration layer of the substrate. The resulting Schottky barrier diode provides a high destroy by electric power level and is less likely to break down.

BRIEF DESCRIPTION OF THE DRAWINGS

The invention will be described in greater detail with reference to a preferred embodiment thereof and the accompanying drawings, wherein:

FIGS. 5(A)–5(C) are graphs showing the results of destroy by electric power test when parameters, namely the thickness w and the depth x is varied, wherein FIG. 5(A) shows variations in the destructive electric power in relation to the thickness of N⁻ layers of Schottky barrier diodes having a withstand voltage of 30 volts, FIG. 5(B) shows variations in the destructive electric power in relation to the thickness of N⁻ layers of Schottky barrier diodes having a withstand voltage of 40 volts, and FIG. 5(C) shows variations in the destructive electric power in relation to the thickness of N⁻ layers of Schottky barrier diodes.

DETAILED DESCRIPTION OF THE PREFERRED EMBODIMENT

Figure 1:
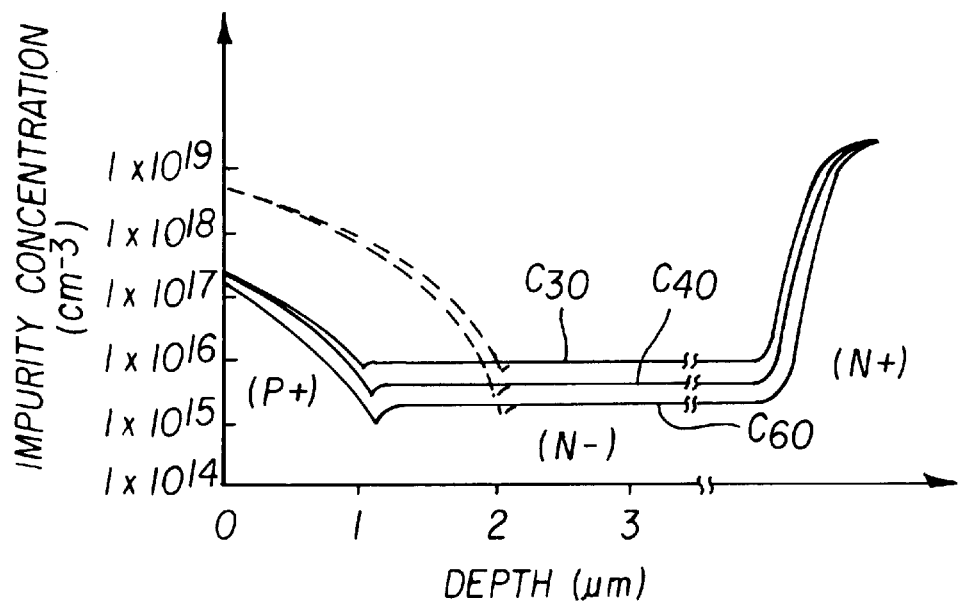
FIG. 1 is a graph illustrating the distribution of the impurity concentration along a vertical cross section of Schottky barrier diodes.

One preferred embodiment of the present invention will be described in detail referring to the drawings.

Figure 2:
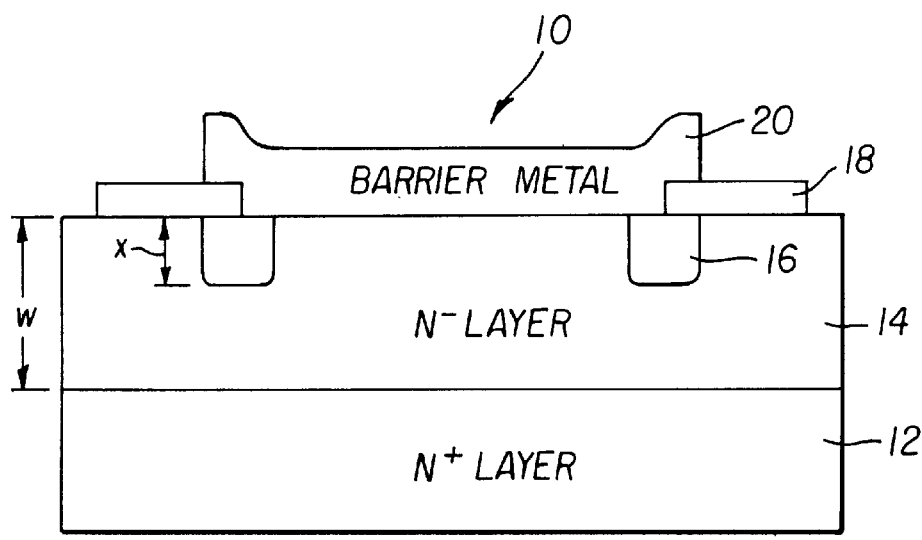
FIG. 2 is a vertical cross sectional view showing the construction of a Schottky barrier diode having a guard ring structure.

FIG. 2 is a vertical cross sectional view showing the construction of a Schottky barrier diode having a guard ring structure. As shown in FIG. 2, the Schottky barrier diode 10 consists of N⁺ layer 12, N⁻ layer 14, guard ring region 16, oxide film 18 and barrier metal 20. The N⁺ layer 12 is a semiconductor substrate formed of silicon, and the N⁻ layer 14 is grown on the N⁺ layer 12 by an epitaxial method. The thickness of the N⁻ layer 14 is represented by "w" in FIG. 2. The guard ring region 16 is a P-type region that is formed by implanting and diffusing boron ions into the surface of the N⁻ layer 14 by ion implantation. The depth of the diffused region 16 is represented by "x" in FIG. 2. The oxide film 18 is formed on the N⁻ layer 14 to overlie or cover the outer surface area of the guard ring region 16, and the barrier metal 20 made of molybdenum is formed as a metal contact on the N⁻ layer 14 for contact with the inner surface area of the guard ring region 16. In the following, the impurity concentration of the Schottky barrier diode 10 constructed in this manner, particularly, that of the guard ring region 16, will be described in greater detail.

FIG. 1 is a graph illustrating the distribution of the impurity concentration along the vertical cross section of some specimens of Schottky barrier diodes. In FIG. 1, the horizontal axis indicates the distance from the surface of the guard ring region 16 as measured in the depth direction of the diodes, whereby the left, middle, and right parts of the graph correspond to the P⁺ layer of the guard ring region 16, N⁻ layer 14, and N⁺ layer 12, respectively. The vertical axis indicates the impurity concentration. The graph of FIG. 1 shows the distributions of the impurity concentration of three Schottky barrier diodes having different withstand voltages, along with those of known counterparts for comparison.

In FIG. 1, the curve $C_{30}$ indicates changes in the impurity concentration of a Schottky barrier diode having a withstand voltage of 30 volts. The curve $C_{40}$ indicates changes in the impurity concentration of a Schottky barrier diode having a withstand voltage of 40 volts. The curve $C_{60}$ indicates changes in the impurity concentration of a Schottky barrier diode having a withstand voltage of 60 volts. The dotted-line curves respectively connected to the curves $C_{30}$, $C_{40}$, $C_{60}$ indicate changes in the impurity concentration of known prior art Schottky barrier diodes having corresponding withstand voltages.

As is apparent from FIG. 1, the Schottky barrier diodes according to the present invention are characterized in that the guard ring region 16 has a low impurity concentration at its surface, and that the depth of the diffusion layer of the guard ring region 16 has a small depth "x", as compared with the known Schottky barrier diodes. Although the impurity concentration at the surface of the guard ring region 16 varies more or less depending upon the diode, it is generally not greater than $5 \times 10^{17}/cm^3$, and, in particular, is in the range of $2-3 \times 10^{17}/cm^3$ in the Schottky barrier diodes of 30- to 60-volt classes as shown in FIG. 1. When comparing diffusion profiles of the diodes of the present invention with those of the known diodes, the slope of the impurity concentration of the present diode is less steep than that of the known diode, and therefore a depletion region that appears in the diffusion layer of the present diode upon application of a reverse voltage extends to a greater length, resulting in a reduced possibility of avalanche breakdown. The depth "x" of the diffusion layer of the guard ring region 16 is generally not greater than 1.5 μm, and about 1 μm in the case of the 30- to 60-volt class diodes of FIG. 1. This depth "x" of the diffusion layer may be reduced to a minimum provided required withstand voltage can be ensured. This is because the thickness "w" of the N⁻ layer 14 has to be increased if the depth of the diffusion layer is increased, and the increase in the thickness "w" results in an increase in the resistance in silicon crystal, which in turn results in an increase in the forward voltage drop.

Figure 3:
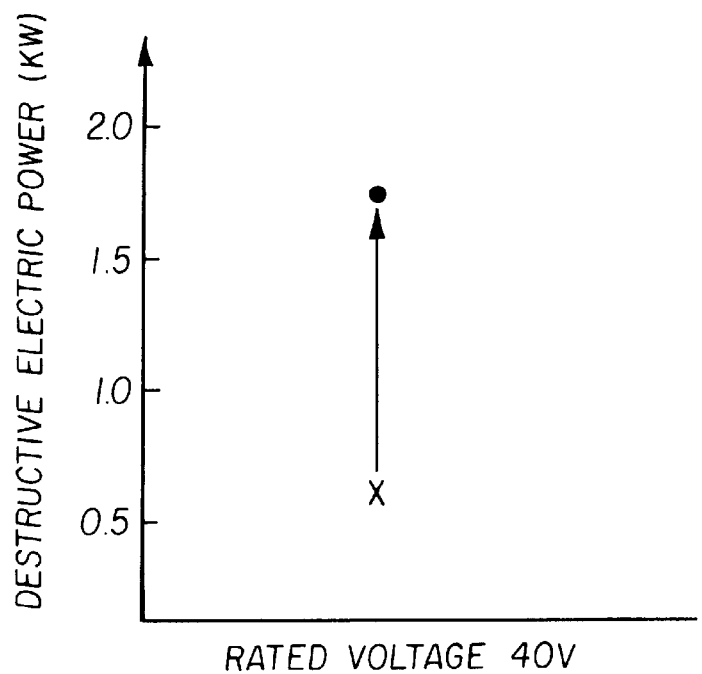
FIG. 3 is a view showing the result of an destroy by electric power test.

FIG. 3 is a graph showing the result of an destroy by electric power test. In this graph, "x" indicates a destructive electric power of a known prior art Schottky barrier diode having a rated voltage of 40V, and "●" indicates a destructive electric power of a Schottky barrier diode of the present invention having the same rated voltage of 40V. According to the test result, the destructive electric power of the known Schottky barrier diode is about 0.6 kilowatt (KW), and the destructive electric power of the Schottky barrier diode of the invention is about 1.75 kilowatt (KW). Thus, the destructive electric power of the present diode is increased to be about three times as high as that of the known diode having the same rated voltage.

Figure 4:
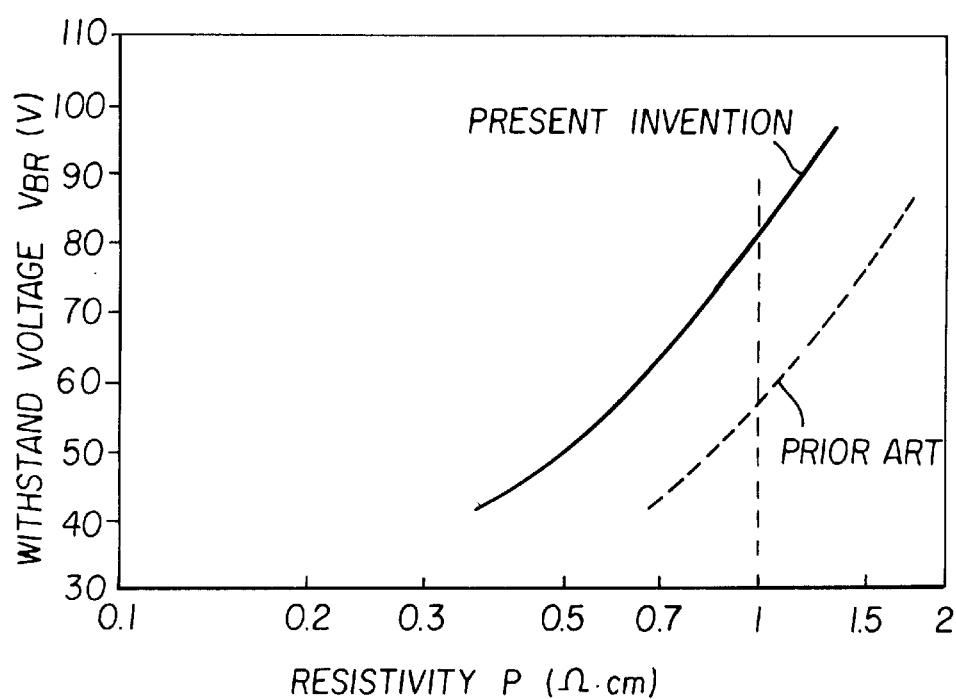
FIG. 4 is a graph showing the relationship between the withstand voltage and the resistivity of N⁻ layer.

FIG. 4 is a graph illustrating the relationship between the withstand voltage and the resistivity of the N⁻ layer. In this graph, the horizontal axis represents the resistivity ρ of the N– layer, and the vertical axis represents the withstand voltage $V_{BR}$. The broken-line curve indicates the characteristic of known prior art Schottky barrier diode, and the solid-line curve indicates the characteristic of Schottky barrier diode of the present invention. When the resistivity is 1 Ω·cm, for example, the withstand voltage of the known Schottky barrier diode is about 55 volts while the withstand voltage of the Schottky barrier diode of the present invention is increased up to about 80 volts. When comparing the characteristics of these diodes at the same withstand voltage, the resistivity of the present diode can be made lower than that of the known diode. Thus, the forward voltage drop VF can be reduced according to the present invention. The withstand-voltage characteristic of the diode of the present invention is thus improved for the following reason: while depletion layers extend in both directions from the boundary between the diffusion layer of the guard ring region 16 and the N⁻ layer 14, the depletion layer formed in the diffusion layer extends to a greater length than in the known diode due to the gentler slope of the impurity concentration of the diffusion layer, and therefore avalanche breakdown occurs at an increased voltage. Thus, the breakdown that has occurred mainly in the diffusion layer in the known diode occurs in the N⁻ layer 14 in the diode of the present invention. In this connection, the thickness "w" of the N⁻ layer 14 must be large enough to prevent the depletion region extending into the N⁻ layer 14 from reaching and contacting the N⁺ layer 12 upon application of a reverse voltage.

Figure 5A:
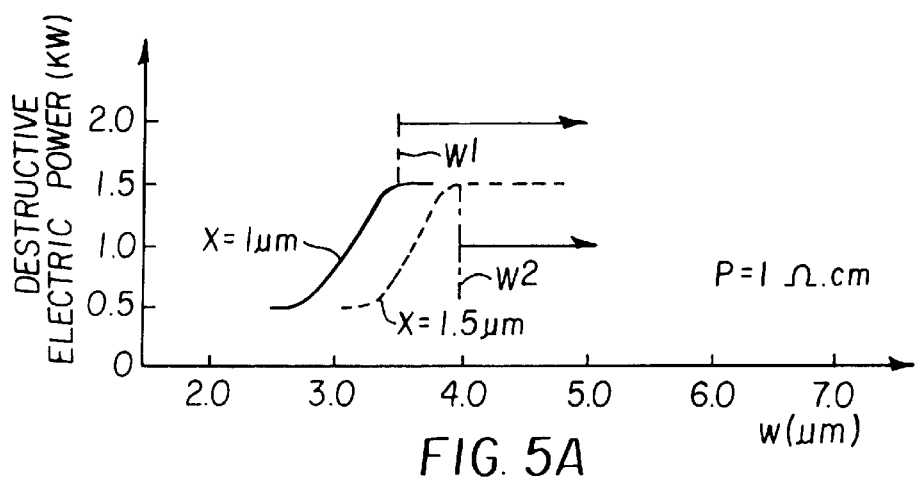
Figure 5B:
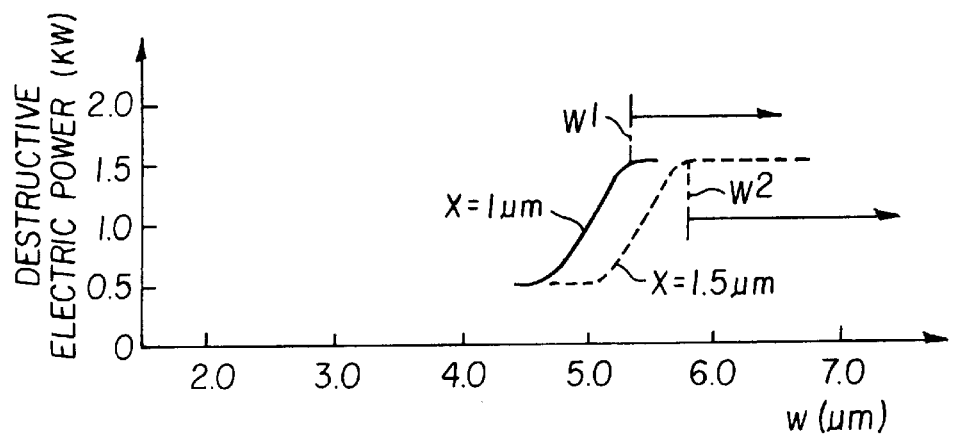
Figure 5C:
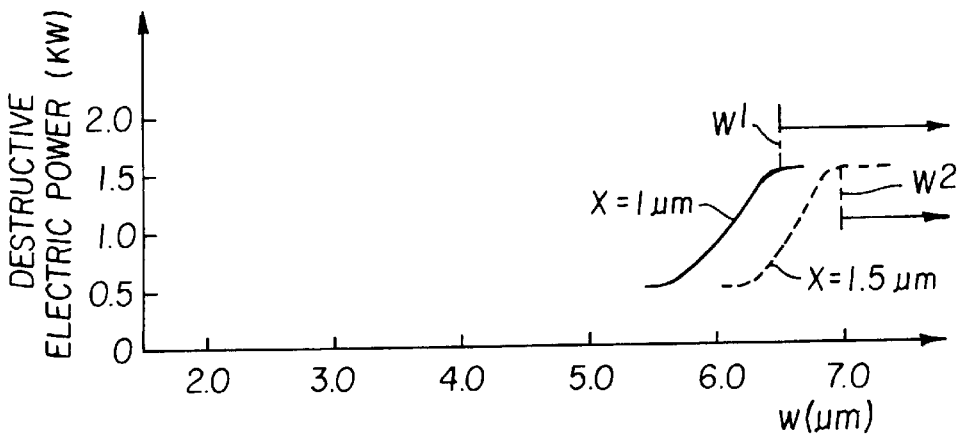

FIGS. 5(A) through 5(C) are graphs showing the results of an destroy by electric power test conducted on Schottky barrier diodes having three different withstand voltages, wherein parameters, namely the thickness w and the depth x is varied. More specifically, the graphs of FIGS. 5(A)–5(C) show a variation in the destructive electric power of each of these diodes in relation to the thickness "w" of the N⁻ layer 14 when the depth "x" of the diffusion layer of the guard ring region 16 is varied. The resistivity ρ of the N⁻ layer 14 of each diode is equal to 1 Ω·cm.

In the graph of FIG. 5(A) showing the case where Schottky barrier diodes having a withstand voltage of 30V are used, the solid line indicates a variation in the destructive electric power in relation to the thickness "w" of the N⁻ layer 14 when the depth "x" of the diffusion layer is equal to 1 μm, and the broken line indicates a variation in the destructive electric power when the depth "x" of the diffusion layer is equal to 1.5 μm. In the graph of FIG. 5(B) showing the case where Schottky barrier diodes having a withstand voltage of 40V are used, the solid line indicates a variation in the destructive electric power in relation to the thickness "w" of the N⁻ layer 14 when the depth "x" of the diffusion layer is equal to 1 μm, and the broken line indicates a variation in the destructive electric power when the depth "x" of the diffusion layer is equal to 1.5 μm. In the graph of FIG. 5(C) showing the case where Schottky barrier diodes having a withstand voltage of 60V are used, the solid line indicates a variation in the destructive electric power in relation to the thickness "w" of the N⁻ layer 14 when the depth "x" of the diffusion layer is equal to 1 μm, and the broken line indicates a variation in the destructive electric power when the depth "x" of the diffusion layer is equal to 1.5 μm. Each of the characteristic curves in these graphs has a saturation point up to which the destructive electric power of each diode increases. According to one feature of the present invention, the thickness "w" of the N⁻ layer 14 is made larger than at least the thickness corresponding to the saturation point, so that the Schottky barrier diode assures a required withstand voltage characteristic. For example, the N⁻ layer 14 of the Schottky barrier diode having a withstand voltage of 30 volts needs to have the minimum thickness "w1" of about 3.5 μm when "x" is equal to 1 μm, and the minimum thickness "w2" of about 4 μm when "x" is equal to 1.5 μm, so that the diode assures the required withstand voltage characteristic. This relationship can be represented by the following expression:

$$w \geq x + 0.55 \cdot (\rho \cdot V)^{1/2} \quad (1)$$

where "V" is the maximum applied voltage. The right side of this expression represents the length of the depletion layer that extends into the N⁻ layer 14 when the reverse voltage "V" is applied. Accordingly, the thickness "w" of the N⁻ layer 14 is controlled to be equal to or greater than the value of the right side of the above expression (1) that is determined by the depth "x" of the diffusion layer of the guard ring, resistivity ρ of the N⁻ layer 14, and the maximum applied voltage "V". By controlling the depth "x" of the diffusion layer of the guard ring, thickness "w" of the N⁻ layer 14 and the resistivity ρ to such values that satisfy this condition, the resulting Schottky barrier diode exhibits a high destructive electric power value, and becomes less likely to break down.

According to the present invention as described above, the Schottky barrier diode having a guard ring structure is constructed such that the impurity surface concentration and depth of the diffusion layer of the guard ring are reduced to be lower than those of the known diode. As a result, breakdown that has occurred mainly in the guard ring region in the known diode occurs in the other region of the device, thus reducing a possibility of breaking the diode. Also, the thickness of the N⁻ layer 14 is controlled to the minimum value determined by the required withstand voltage, so that the forward voltage drop can be reduced. Thus, a circuit including a rectifying element for a switching power supply can be designed with increased freedom, using as the rectifying element the Schottky barrier diode having reduced forward voltage drop and increased resistance to breakdown, and the efficiency of the power supply can be increased.

What is claimed is:

1. A Schottky barrier diode comprising:

a substrate including a first-conductivity-type low concentration layer and a first-conductivity-type high concentration layer; and a guard ring region comprising a second-conductivity-type diffusion layer having an impurity surface concentration of not greater than $5 \times 10^{17}/cm^3$, formed in said first-conductivity-type low concentration layer;

wherein said first-conductivity-type low concentration layer has a thickness large enough to prevent a depletion layer that appears in the low concentration layer upon application of a maximum reverse voltage from reaching said first-conductivity-type high concentration layer; and wherein said thickness of said first-conductivity-type low concentration layer is controlled to be not smaller than a value represented by:

$$x + 0.55 \cdot (\rho \cdot V)^{1/2}$$

where "x" is a thickness of said diffusion layer of said guard ring region, "ρ" is a resistivity of said first-conductivity-type low concentration layer, and "V" is a maximum applied voltage.

2. A Schottky barrier diode as defined in claim 1, wherein the thickness of said diffusion layer of said guard ring region is controlled to be not greater than 1.5 μm.

* * * * *